(12) United States Patent
Pan

(10) Patent No.: US 7,468,830 B2
(45) Date of Patent: Dec. 23, 2008

(54) IN SITU APPLICATION OF ANTI-STICTION MATERIALS TO MICRO DEVICES

(75) Inventor: Shaoher X. Pan, San Jose, CA (US)

(73) Assignee: Spatial Photonics, Inc., Sunnyvale, CA (US)

( * ) Notice: Subject to any disclaimer, the term of this patent is extended or adjusted under 35 U.S.C. 154(b) by 16 days.

(21) Appl. No.: 11/427,327

(22) Filed: Jun. 28, 2006

(65) Prior Publication Data

US 2008/0055703 A1 Mar. 6, 2008

(51) Int. Cl.
*G02B 26/00* (2006.01)

(52) U.S. Cl. ........................ 359/290; 359/291

(58) Field of Classification Search ................ 359/237, 359/238, 290, 291
See application file for complete search history.

(56) References Cited

U.S. PATENT DOCUMENTS

| 6,930,367 | B2* | 8/2005 | Lutz et al. ................. 257/417 |
| 6,992,810 | B2 | 1/2006 | Pan et al. |
| 7,045,170 | B1* | 5/2006 | Hankins et al. ......... 427/255.18 |
| 2005/0118742 | A1* | 6/2005 | Henning et al. ............ 438/48 |
| 2005/0128564 | A1 | 6/2005 | Pan |
| 2007/0115532 | A1* | 5/2007 | Chen et al. ................. 359/290 |
| 2007/0258130 | A1* | 11/2007 | Chen et al. ................. 359/291 |
| 2008/0094738 | A1* | 4/2008 | Lee ............................ 359/829 |

OTHER PUBLICATIONS

W. R. Ashurst et al., "An improved vapor-phase deposition technique for anti-stiction monolayers", Proceedings of the SPIE: Photonics West 2004, vol. 5342, San Jose, CA, Jan. 24-29, pp. 204-211, (2004).
W. Robert Ashurst et al., "Dichlorodimethylsilane as an Anti-Stiction Monolayer for MEMS: A Comparison to the Octadecyltrichlosilane Self-Assembled Monolayer", Mar. 2001, Journal of Microelectromechanical Systems, vol. 10, No. 1, pp. 41-49.
W. Robert Ashurst et al., "Vapor Phase Anti-Stiction Coatings for MEMS", Dec. 2003, IEEE Transactions on Device and Materials Reliability, vol. 3, No. 4, pp. 173-178.
Boris Kobrin et al., "Molecular Vapor Deposition—An Improved Vapor-Phase Deposition Technique of Molecular Coatings for MEMS Devices", SEMICON® West 2004, Jul. 2004, Semiconductor Equipment and Materials International, 4 pp.

(Continued)

*Primary Examiner*—Jessica T Stultz
*Assistant Examiner*—Mahidere S Sahle
(74) *Attorney, Agent, or Firm*—Fish & Richardson P.C.

(57) ABSTRACT

A method for applying anti-stiction material to a micro device on a substrate includes introducing anti-stiction material on a surface of an encapsulation device or a surface of the substrate and sealing at least a portion of the encapsulation device to the surface of the substrate to form a chamber to encapsulate the micro device and the anti-stiction material. The micro device includes a first component and a second component. The first component is moveable and is configured to contact the second component. The method also includes vaporizing the anti-stiction material and depositing the anti-stiction material on a surface of the first component or a surface of the second component after vaporizing the anti-stiction material to prevent stiction between the first component and the second component.

8 Claims, 5 Drawing Sheets

OTHER PUBLICATIONS

Roya Maboudian, "Surface processes in MEMS technology", 1998, Surface Science Reports 30, pp. 207-268.

Coatings for Nanotechnologies, "Superior MVD™ coatings makes Sensors, MEMS and Bio-Devices work better, enable advancements in Nanotechnology", 2004, Applied Microstructures, Inc., 4 pp.

"Molecular Vapor Deposition ( MVD)™ for the Modification of Surfaces in BioMEMS", 2006, Applied Microstructures, Inc., 1 p.

"Molecular Vapor Deposition™", 2006, Applied Microstructures, Inc., 2 pp.

"Surface Modification by Molecular Vapor Deposition (MVD) ™", 2004, Applied Microstructures, Inc., 1 p.

"MVD™ for Bio MEMS", 2005, Applied Microstructures, Inc., 1 p.

"MVD™ for MEMS Devices", 2005, Applied Microstructures, Inc., 1 p.

* cited by examiner

IN SITU APPLICATION OF ANTI-STICTION MATERIALS TO MICRO DEVICES

BACKGROUND

The present disclosure relates to the micro devices.

Assuring reliability and yield are two critical tasks for the manufacturing of micro devices, such as integrated circuits and micro electromechanical systems (MEMS). Typically, in manufacturing micro devices, multiple micro devices are fabricated on a semiconductor wafer. The semiconductor wafer is then separated into individual dies each containing one or more individual micro devices. The electrical and optical performance of the micro devices are often tested for quality assurance on the individual dies in an ambient environment. For testing purposes, electrical and optical signals need to be properly input into the circuits in each micro device. Output electric and optical signals from the micro devices need to be properly detected and measured to analyze the functional performance of the micro devices. During testing and handling of the micro devices, the micro devices must not be contaminated by dust and pollutants in the ambient environment. Electrical and optical input and output, as well as protecting the micro devices from the environment, all need to be considered when designing packaging for the micro devices. Given the increased complexity of the micro devices and the testing requirements, a need exists for improved die packaging for the micro devices.

A common problem for MEMS is stiction between components that can contact each other during operations. For example, a micro mirror built on a substrate can include a tiltable mirror plate. The micro mirror can be driven by electrostatic forces to tilt about an axis. The mirror plate can tilt to two positions: an "on" position, wherein the micro mirror plate directs incident light to a display device, and an "off" position, wherein the micro mirror plate directs incident light away from the display device. The mirror plate can be stopped by mechanical stops at the "on" or the "off" positions so that the orientation of the mirror plate can be precisely defined at these two positions. For some micro mirror devices, the mirror plate stopped at the "on" or the "off" position must be able to overcome stiction between the mirror and the stop. A delay in the response of the mirror plate can be less than optimum in environments that require that the mirror respond quickly.

SUMMARY

In one general aspect, the present invention relates to a method for applying anti-stiction material to a micro device on a substrate. The method includes introducing anti-stiction material on a surface of an encapsulation device or a surface of the substrate, wherein the micro device comprises a first component and a second component, and the first component is moveable and is configured to contact the second component; sealing at least a portion of the encapsulation device to the surface of the substrate to form a chamber to encapsulate the micro device and the anti-stiction material; vaporizing the anti-stiction material; and after vaporizing the anti-stiction material, depositing the anti-stiction material on a surface of the first component or a surface of the second component to prevent stiction between the first component and the second component.

Implementations of the method may include one or more of the following. The step of sealing can include applying an adhesive to the encapsulation device or to the surface of the substrate; after applying the adhesive, bringing the encapsulation device and the surface of the substrate together with the adhesive therebetween; and after bringing the encapsulation device and the surface of the substrate together, curing the adhesive. Alternatively, the step of sealing can include bonding at least a portion of the encapsulation device to the surface of the substrate by plasma surface activated bonding. The step of sealing can include sealing at least a portion of the encapsulation device to the surface of the substrate in a vacuum environment to form an at least partially evacuated chamber to encapsulate the micro device and the anti-stiction material. The step of vaporizing can include heating the anti-stiction material. The step of vaporizing can be after the sealing step. The step of depositing the anti-stiction material can include depositing the anti-stiction material on substantially all the surfaces of the micro device.

In another general aspect, the present invention relates to a micromechanical system including: a substrate; a micro device on the substrate, wherein the micro device comprises a first component and a second component, and the first component is moveable and is configured to contact the second component; anti-stiction material coated on a surface of the first component or a surface of the second component to prevent stiction between the first component and the second component; and an encapsulation device bonded with the surface of the substrate to form a chamber to encapsulate the micro device. The anti-stiction material can be vaporized at a temperature below 450° C. The anti-stiction material can be vaporized at a temperature below 300° C. The step of vaporizing can include evaporating the anti-stiction material, subliming the anti-stiction material, or a combination thereof.

Implementations of the system may include one or more of the following. The anti-stiction material can include one or more of 3,3,3 trifluoro-propylmethyldichlorosilane (PM-DCS), tridecafluoro-1,1,2,2-tetrahydrooctyltrichlorosilane (FOTS), heptadecafluoro-1,1,2,2,-tetrahydrodecyltrichlorosilane (FDTS), dodecyltrichlorosilane (DDTCS), dimethyldichlorosilane (DDMS), vinylundecyltirchlorosilane (V11TCS), aminopropyltrimethoxysilane (APTMS), epoxides, methacroloxy, maleimide-polyethylene glycol (mPEG), or mercaptosilane.

The second component can be stationary relative to the substrate. The first component can be a tiltable micro mirror plate that is configured to tilt in response to an external electric signal. The encapsulation device can include an encapsulation cover. At least a portion of the encapsulation cover can be transparent to visible light. The encapsulation device can include a plurality of spacer walls each of which extends from the encapsulation cover and comprises at least one surface configured to be sealed to the surface of the substrate.

Implementations may also include one or more of the following advantages. A potential advantage of the disclosed systems and methods is simplification of the fabrication process of the micro-device. Anti-stiction material can be applied to a plurality of micro devices after the micro devices are packaged on a semiconductor wafer (i.e. in situ). The anti-stiction material can be introduced on the inside surfaces of an encapsulation device or the upper surface of the substrate before the encapsulation of the micro device. The encapsulation device is then sealed to the upper surface of the substrate to form a chamber to encapsulate the anti-stiction material and the micro device. The anti-stiction material in the chamber can be evaporated or sublimed by heating. The evaporated anti-stiction material can be deposited on the surfaces of the micro devices to prevent stiction between components that can contact each other in the operation of the micro device. In contrast, anti-stiction material is conventionally deposited on the surface of the components during the fabrication of the micro devices. The in situ application of anti-stiction material disclosed in the present specification reduce the device development and testing times, and thus enable shorter time to the market.

The disclosed methods and systems may be useful for providing anti-stiction materials on contact areas that are hidden in a micro device. For example, the contact surfaces between a tiltable mirror plate and a landing tip on a substrate can be hidden underneath the mirror plate. The contact surfaces are often formed at the final stage of the device fabrication. The disclosed methods and system can provide a way to isotropically deposit anti-stiction material on the contact surfaces that are hidden by other components of the micro device.

Another potential advantage of the disclosed systems and methods is that anti-stiction materials can be applied to a plurality of micro devices outside of a vacuum environment. The anti-stiction materials can be applied to the micro devices after they are encapsulated in micro chambers formed by an encapsulation cover sealed to the semiconductor wafer. The semiconductor wafer containing the encapsulated micro devices can be diced to form separate dies.

Yet another potential advantage of the disclosed system and methods is increased flexibility in selection and method of application of the anti-stiction material to micro devices. The disclosed methods can be applicable to small and large micro devices with no or minimal incremental cost in scaling up the device sizes. The disclosed methods may also be applicable to different types of devices without being affected by the detailed fabrication process.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles, devices and methods described herein.

DETAILED DESCRIPTION

Figure 1:
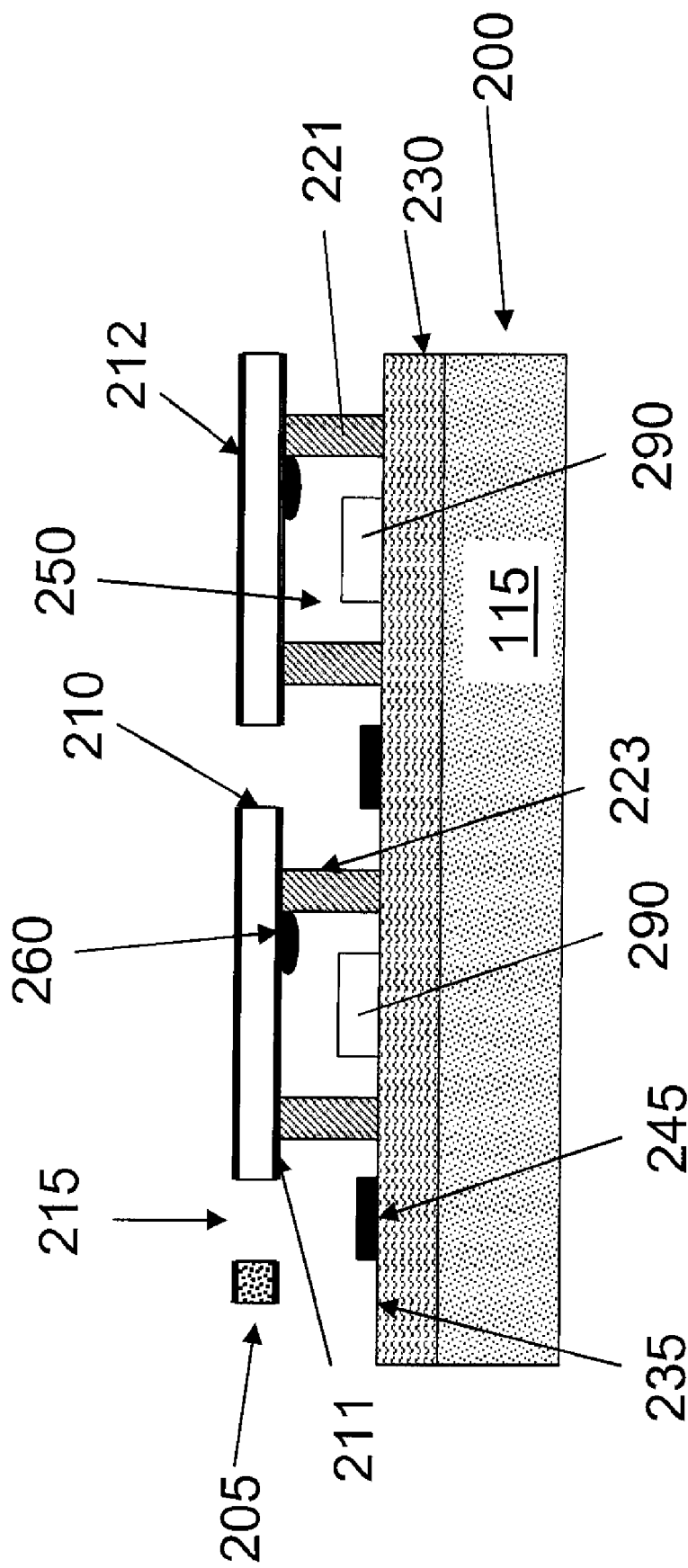
FIG. 1 is a cross-sectional view of a substrate having one or more micro devices encapsulated by a encapsulation device.
Figure 2A:
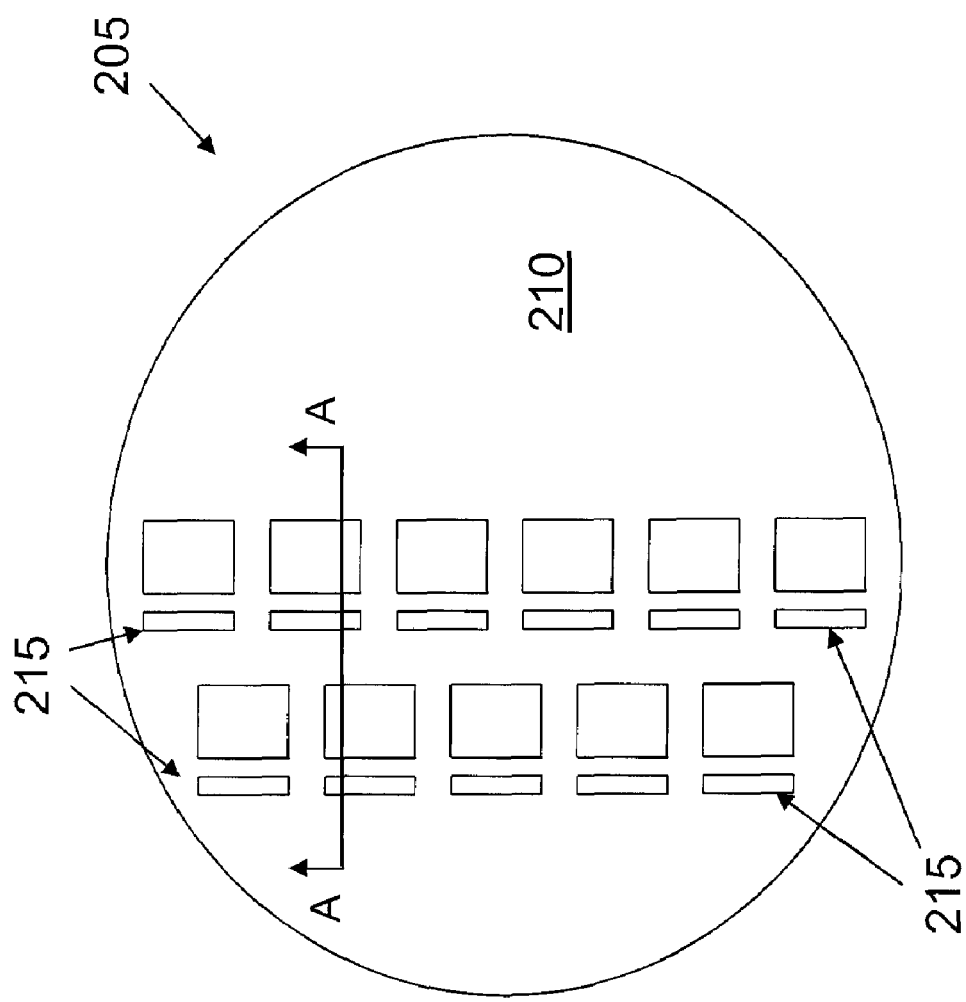
FIG. 2A is a plan view of an encapsulation device.
Figure 2B:
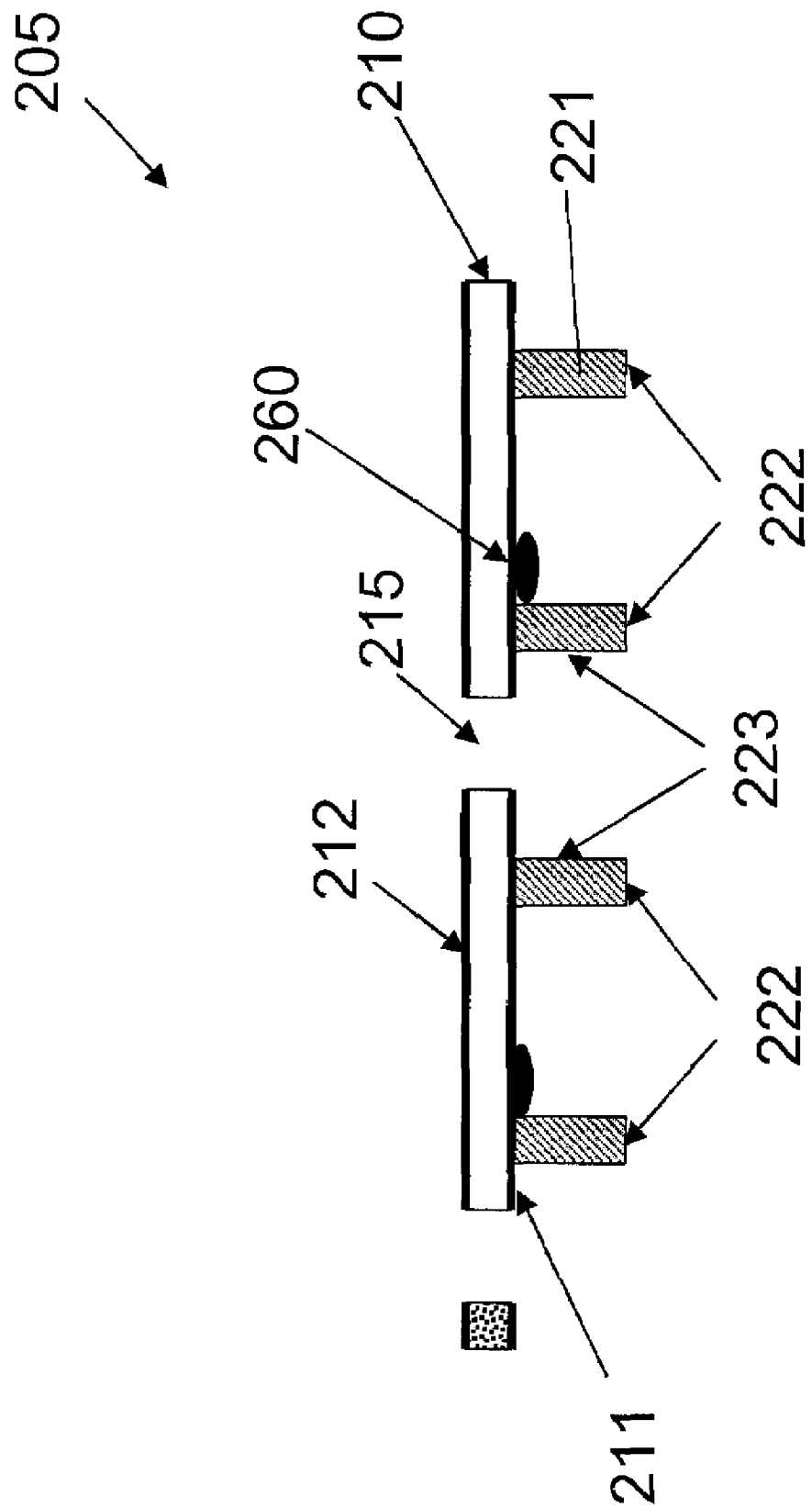
FIG. 2B is a cross-sectional view of the encapsulation device of FIG. 2A.
Figure 3:
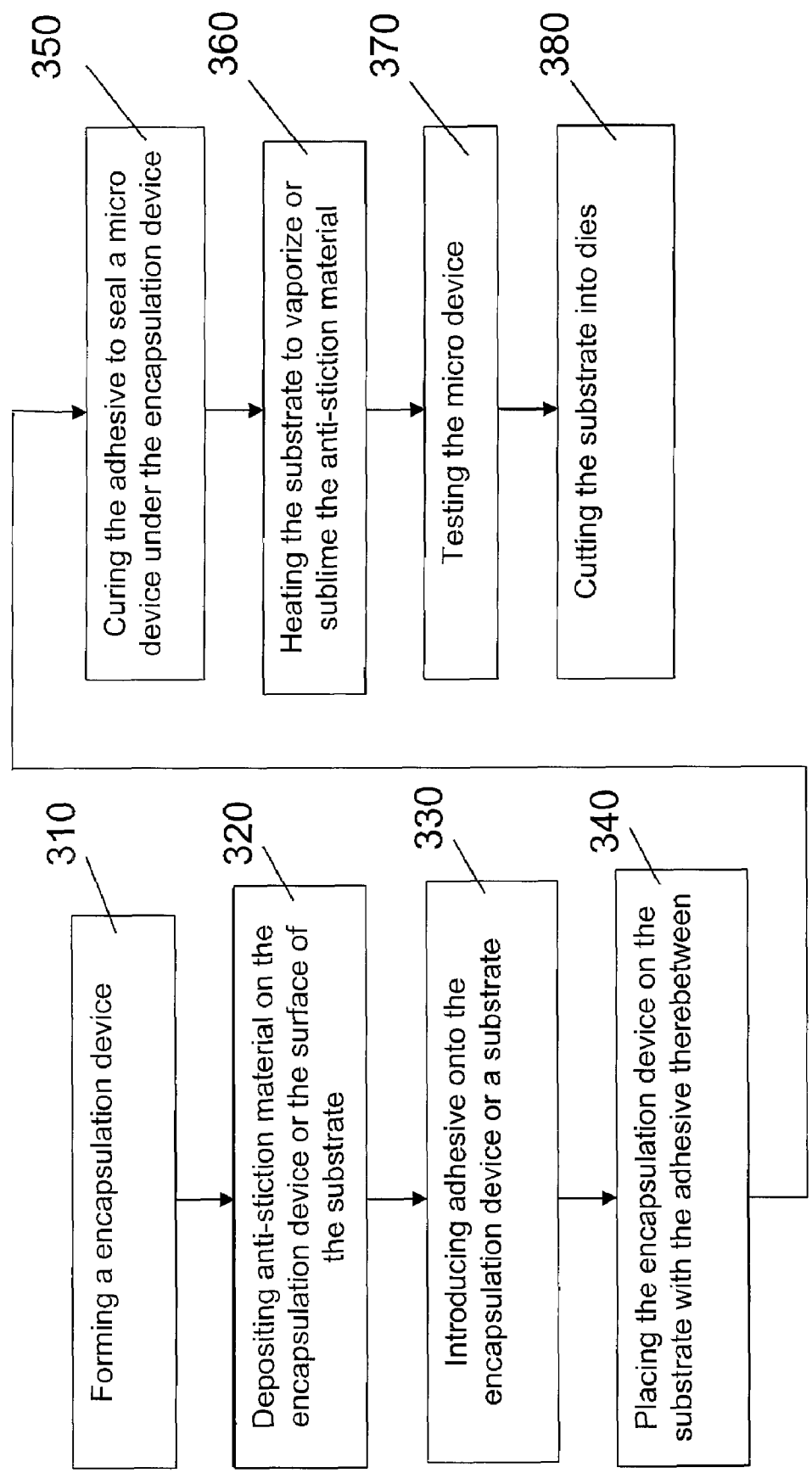
FIG. 3 is a flowchart for encapsulating micro devices on a semiconductor wafer.

FIG. 1 is a cross-sectional view of a substrate having encapsulated micro devices. FIGS. 2A and 2B are a plan view and a cross-sectional view of an encapsulation device. FIG. 3 is a flowchart for encapsulating micro devices on a semiconductor wafer.

A plurality of micro devices 290 are provided on a semiconductor wafer 200, as shown in FIG. 1. The semiconductor wafer 200 includes a substrate 115 and a circuit layer 230. The micro devices 290 are located on the circuit layer 230. The circuit layer 230 includes electronic circuits that process input signals received at electric terminals 245 and send the signals to the micro devices 290. One or more components in the micro device 290 can move under the control of the input signal and to come to contact with another component in the micro device 290. Output signals from the micro devices 290 can also be transmitted to the electric terminals 245 via an electric circuit in the circuit layer 230. The semiconductor wafer 200 can also include a plurality of electric terminals 245 for receiving input signals for the micro devices 290 or output signals from the micro devices 290.

One or more droplets of an anti-stiction material 260 are on the lower surface of the encapsulation cover 210 on the upper surface 235 of the substrate 115. The anti-stiction material can be anywhere within a chamber formed by the encapsulation cover 210 and the substrate 115. The anti-stiction material 260 can include one or more of 3,3,3 trifluoro-PMDCS, tridecafluoro-1,1,2,2-tetrahydrooctyltrichlorosilane (FOTS), heptadecafluoro-1,1,2,2,-tetrahydrodecyltrichlorosilane (FDTS), dodecyltrichlorosilane (DDTCS), dimethyldichlorosilane (DDMS), vinylundecyltirchlorosilane (V11 TCS), aminopropyltrimethoxysilane (APTMS), epoxides, methacroloxy, maleimide-polyethylene glycol (mPEG), mercaptosilane, or other suitable molecular films, which are available from Applied MicroStructures, Inc. located at San Jose, Calif. The anti-stiction materials are capable of reducing adhesion or stiction at the contact interface between two objects. The anti-stiction materials can be applied, for example, using an applicator for polymer materials. This droplet is then used to form a layer of anti-stiction material on the micro device, as described further below.

Referring to FIG. 3, an encapsulation device is formed (step 310). An exemplary encapsulation device 205 is shown in FIGS. 2A and 2B. The encapsulation device 205 can include an encapsulation cover 210 that has an upper surface and a lower surface and a plurality of spacer walls 221 that are connected with the lower surface of the encapsulation cover 210. The encapsulation cover 210 and spacer walls 221 can be an integral piece or be separate pieces joined together.

The encapsulation cover 210 can be made of a transparent material, such as glass or silicon dioxide, which allows visual and microscopic examinations of the micro devices 290 after the encapsulation of the micro device 290. The transparent encapsulation cover 210 also allows optical communications with micro devices 290 that are opto-electrical devices, such as micro-mirror based spatial modulation devices. Antireflective layers 212 and 211 can be coated on the top and lower surfaces of the encapsulation cover 210, respectively. The antireflective layers 212 and 212 can reduce intensity loss in the incident light and output light at the surfaces of the encapsulation cover 210. Optionally, the encapsulation layer 210 is coated with one or more antireflective layers.

In general, the anti-reflective layers 211 and 212 can be a thin film made of dielectric or metallic materials, which may include a single layer of multiple layers of such materials. The materials for the ant-reflective layer 211 and 212 can include metal oxide, silicon oxides, such as $TiO_x/SiO_x$, $NbO_x/SiO_x$, $TaO_x/SiO_x$, and $MgF_2/SiO_x$. The anti-reflective layers 211 and 212 can be made of the same or different materials. The ant-reflective layer 211 and 212 can be deposited by physical vapor deposition (PVD), chemical vapor deposition (CVD), or molecular beam epitaxy (MBE) in the vacuum environment.

The anti-reflective layers 211 and 212 reduce the light reflectance and thereby increase the light transmittance at the two surfaces of the encapsulation layer 210. The anti-reflective layers 211 and 212 create two interfaces on each side of the anti-reflective layer 211 or 212: the air/anti-reflective-layer interface and the anti-reflective-layer/encapsulation-cover interface. The light transmittance is increased by constructive interference between the transmitted light at the two interfaces. The light reflectance is decreased by destructive interference between the reflected light at the two interfaces. The reflections from the two interfaces are 180 degrees out of phase (thus creating destructively interference with each other) if the coating is a quarter wavelength thickness and the index of refraction of the anti-reflective layer is less than that of the glass.

The spacer walls 221 can include materials such as an oxide, such as silicon oxide, silicon, or a metal. Each spacer wall 221 can include one or more side faces 223 and a base face 222. The spacer walls 221 can be formed by first depositing a layer of spacer material followed by selective removal of the spacer material using standard photolithography and etching.

Anti-stiction material is deposited on the encapsulation device or on a surface of the substrate (step 320). Alternatively, the anti-stiction material can be placed on the micro device itself.

An adhesive material such as a polymer epoxy can be applied to the encapsulation device, such as to the base face 222 of the spacer walls 221 or to the surface areas surrounding each micro device 290 on the substrate 115 (step 330). The encapsulation device 205 is then placed on the substrate with the adhesive therebetween (step 340) so that the base face 222 of the spacer walls 221 come to contact and seal to the upper surface 235 of the substrate 115. If necessary, the encapsulation device 205 and substrate 115 are pressed together. The adhesive is then cured, such as by heat or UV irradiation (step 350) to form a seal the micro device under the encapsulation device. The bond can be a semi-hermetic bond between the spacer walls 221 and the encapsulation cover 210. A chamber 250 formed by the spacer walls 221 and the encapsulation cover 210 encloses a micro device 290 and the anti-stiction material 260 previously applied to the lower surface of the encapsulation cover 210 or the upper surface 235 of the substrate 115 (in step 320). The application and the subsequent curing of the adhesive can be conducted in a vacuum environment so that the chamber is at least partially evacuated.

Alternatively, the encapsulation device 205 can be bonded directly to the upper surface 235 of the substrate to encapsulate the micro device 290. For example, hermetic bonding can be made by plasma surface activated bonding. The vacuum or partial vacuum environment in the chamber 250 can be maintained by the air-tight seal between the base faces 222 of the spacer walls 221 and the upper surface 235 of the substrate 115 and the bond between the spacer walls 221 and the encapsulation cover 210.

In some embodiments, the encapsulation device 205 does not have spacer walls. The micro device is in a recessed area on the substrate 115. The height of the micro device does not exceed the upper surface 235 of the substrate 115. The encapsulation device 205 is a flat. An anti-stiction material 260 can be disposed on the lower surface of the encapsulation device 205 or on the upper surface 235 in the recessed area of the substrate 115. The lower surface of the encapsulation cover 210 can be sealed or bonded to the upper surface 235 of the substrate 115 to encapsulate the micro device in a cavity formed by the recessed upper surface 115 and the encapsulation cover 210.

The encapsulation cover 210 can include a plurality of openings 215 that are located outside of the chamber 250. The openings 215 allow access to the electric terminals 245 for the micro devices 290 on the semiconductor wafer 200 so that the micro devices on the semiconductor wafer 200 can be tested electronically before the semiconductor wafer 200 is diced into dies.

After the micro device 290 and the anti-stiction material 260 are encapsulated in a chamber 250, the anti-stiction material 260 is vaporized in the chambers 250 (step 360) to deposit the material on the surfaces of the micro devices 290. The evaporation or the sublimation temperatures can be caused by heating, for example, by placing the semiconductor wafer 200 in an oven or using a laser beam to locally heat the anti-stiction material 260. The anti-stiction material 260 can be in a liquid or solid state before the heating. The anti-stiction material 260 can also be in the form of a viscous polymer melt. In some embodiments, the anti-stiction materials 260 can be vaporized at a temperature lower than 450° C. The vaporization can occur in an evaporation process or a sublimation process. The evaporation or the sublimation temperatures of the anti-stiction materials 260 are lower than 450° C. Thus, if the circuit layer 230 includes a CMOS circuit, when the anti-stiction materials are heated to evaporate the materials from a liquid or sublime the materials from a solid state, the heating will not damage the CMOS circuit. In some embodiments, the evaporation temperature or the sublimation temperatures of the anti-stiction material 260 is below 300° C., for example, 150° C.

The vaporized anti-stiction material 260 deposits on the surfaces of the micro device 290 and forms a thin film coating on the surfaces of the micro device 290. The anti-stiction material is coated on the surfaces of the micro device 290 that come into contact with each other. Because the vaporized anti-stiction material can diffuse within the chamber 250, the anti-stiction material can also be isotropically deposited on the surfaces that are not in contact with other components during the operations of the micro device. In some embodiments, a film of anti-stiction material coated on the surfaces of the micro device 290 is one or more molecular monolayer thick. The thickness of the coated anti-stiction material can be 0.3 nanometer or thicker. In some embodiments, the anti-stiction film is thicker than 1.0 nanometer.

Figure 4:
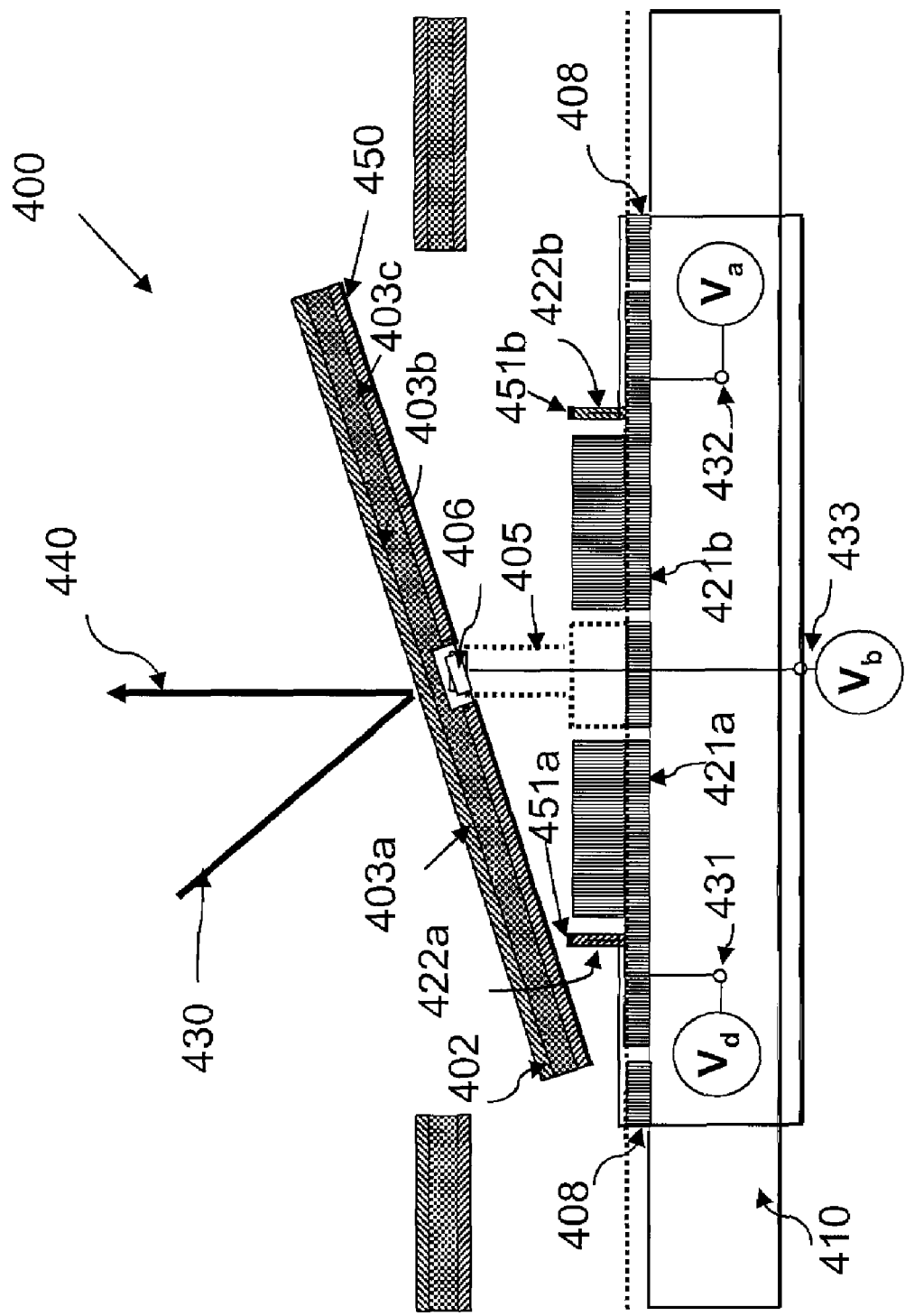
FIG. 4 is a cross-section view of an exemplified micro device mirror in FIG. 1.

An example of a micro device 290 is a spatial light modulation device that includes one or more tiltable micro mirrors. FIG. 4 illustrates a cross section of such a tiltable micro mirror 400 on a substrate 410. The tiltable micro mirror 400 includes a mirror plate 402 that has a flat reflective upper layer 403a that provides the mirror surface, a middle layer 403b that provides mechanical strength to the mirror plate, and a bottom layer 403c. The upper layer 403a can be formed of a reflective material, such as, a thin reflective metallic layer. For example, aluminum, silver, or gold can be used to form the upper layer 403a. The layer thickness can be in the range of 200 to 1000 angstroms, such as about 600 angstroms. The middle layer 403b can be made of a silicon based material, for example, amorphous silicon, typically about 2000 to 5000 angstroms thick. The bottom layer 403c can be built from an electrically conductive material that allows the electric potential of the bottom layer 403c to be controlled relative to the step electrodes 421a or 421b. For example, the bottom layer 403c can be made of titanium and have a thickness in the range of 200 to 1000 angstrom.

The mirror plate 402 includes a hinge 406 that is connected to the bottom layer 403c and is supported by a hinge post 405 that is rigidly connected to a substrate 410. The mirror plate 402 can include two hinges 406 connected to the bottom layer 403c. Each hinge 406 defines a pivot point for the mirror plate 402. The two hinges 406 define an axis about which the mirror plate 402 tilts. The hinges 406 extend into cavities in the lower portion of mirror plate 403. For ease of manufacturing, the hinge 406 can be fabricated as part of the bottom layer 403c.

Step electrodes 421a and 421b, landing tips 422a and 422b, and a support frame 408 can also be fabricated over the substrate 410. The step electrode 421a is electrically connected to an electrode 431 whose voltage Vd can be externally controlled. Similarly, the step electrode 421b is electrically connected with an electrode 432 whose voltage Va can also be externally controlled. The electric potential of the bottom layer 403c of the mirror plate 402 can be controlled by electrode 433 at potential Vb.

The micro mirror plate 402 can be selectively controlled among an array of micro mirror plates by an electric circuit. Bipolar electric pulses can be applied individually to the electrodes 431, 432, and 433. Electrostatic forces can be produced on the mirror plate 402 when electric potential differences are created between the bottom layer 403c on the mirror plate 402 and the step electrodes 421a or 421b. An imbalance between the electrostatic forces on the two sides of the mirror plate 402 causes the mirror plate 402 to tilt from one orientation to another. When the mirror plate 402 is tilted to the "on" position as shown in FIG. 4, the flat reflective upper layer 402 reflects the incident light 430 to produce the reflected light 440 along the "on" direction. The incident light 430 is reflected to the "off" direction when the mirror plate 402 is tilted to the "off" position.

The multiple steps in the step electrodes 421a and 421b narrow the air gap between the mirror plate 402 and the step electrodes 421a or 421b, and can increase the electrostatic forces experienced by the mirror plate 402. The height of the step electrodes 421a and 421b can be in the range from about 0.2 microns to 3 microns.

The landing tips 422a and 422b can have the same height as that of second step in the step electrodes 421a and 421b for manufacturing simplicity. The landing tips 422a and 422b provide a gentle mechanical stop for the mirror plate 402 after each tilt movement. The landing tips 422a and 422b can also stop the mirror plate 402 at a precise angle. Additionally, the landing tips 422a and 422b can store elastic strain energy when they are deformed by electrostatic forces and convert the elastic strain energy to kinetic energy to push away the mirror plate 402 when the electrostatic forces are removed. The push-back on the mirror plate 402 can help separate the mirror plate 402 and the landing tips 422a and 422b, which helps to overcome the stiction of the mirror plate to the substrate, a well known challenge for micro mirror devices.

The evaporation or the sublimation of the anti-stiction material 260 in the chambers 250 can result in the deposition and coating of the anti-stiction material on essentially all the surfaces of the micro mirror 400, including a layer of anti-stiction material 450 on the lower surface of the mirror plate 402 and layers of anti-stiction materials 451a and 451b on the upper surface of the landing tips 422a and 422b (for clarity of viewing, the anti-stiction layers are not shown on other surfaces of the micro mirror 400 in FIG. 4). The anti-stiction material 450, 451a and 451b can reduce adhesion and stiction at these surfaces when the mirror plate 402 comes to contact with the upper surfaces of the landing tip 422a or 422b, which allows timely separation between the mirror plate 402 and the landing tip 422a or 422b when the mirror plate 402 needs to tilted to a new orientation.

In accordance with another aspect of the present invention, the anti-stiction material 260 can coat a thin and clear film on the surfaces of the micro devices 203 such as the micro mirror 400. The clear film can be coated on the lower surface of the mirror plate 402 and the upper surface of the landing tips 422a and 422b. The coating can occur on the surface of the reflective upper layer 403a of the micro mirror 400 and the side surfaces of the landing tips 422a and 422b. The clear film on the upper surface of the reflective upper layer 403a will not substantially alter the reflectivity of the reflective upper layer 403a.

After the anti-stiction material is coated on the one or more surfaces of the micro device 290, the micro device 290 can be tested in situ within the enclosed chamber 250 (step 370). For example, external electric signals can be applied to the electric terminals 245 to create an electric voltage between the bottom layer 403c of the mirror plate 402 and the step electrodes 421a or 421b. The resultant electrostatic force can tilt the mirror plate 402 to different orientations when the mirror plate 402 comes to contact with a landing tip 422a or 422b. The landing tips 422a and 422b are stationary relative the substrate 410. The mirror plate 402 can reflect incident light 430 to form the reflected light 440 in different directions before and after the tilt movement. The reflected light 440 can be measured to evaluate the performance of the micro device 290. Proper electric signals can also be applied to reverse the tilt movement of the mirror plate 402. The coated anti-stiction material helps the separation between the mirror plate 402 and the landing tip 422a or 422b. The functionality of the anti-stiction material can be confirmed by measuring the rate of mirror tilt by detecting the reflected light 440. After the testing of each of the micro devices, the semiconductor wafer 200 can be separated, such as by cutting, dicing, etching or breaking, into individual dies each containing one or more micro devices 290 (step 380). Further testing and packaging may be conducted on the individual dies.

Although multiple embodiments have been described, it will be understood by persons skilled in the relevant art that various changes in form and details can be made therein without departing from the spirit and scope of the ideas presented herein. For example, the micro devices can be fabricated over the wafer substrate in different configurations depending on the specific function and application of the micro devices. A micro device can include electric circuits having a substantially planar surface, or a three dimensional micro-electrical mechanical structure, such as a hinged and tiltable micro mirror for spatial light modulation. The configurations and materials for the encapsulation device can be varied and selected to be best suitable to each application.

It is understood that the disclosed systems and methods are compatible with other configurations of LEDs, optical fibers, and the micro mirrors. For example, the micro devices may reside in a flat area or on a step instead of a recessed area over the substrate. Multiple micro devices can be in an encapsulated recess or flat region. The sealing between the encapsulation cover and the upper surface of the substrate can be realized by many techniques and is not limited by plasma surface activated bonding. The disclosed system and methods are also compatible with different numbers and configurations of the electronic pads for input and output signals to the micro devices. The numbers and the locations of the air-tight closed loop interfaces and air-tight cross interfaces can also be varied without deviating from the spirit of the present specification.

What is claimed is:

1. A micromechanical system, comprising:
  a substrate;
  a micromirror movable on a hinge attached to the substrate from a first position to a second position;
  a landing tip attached to the substrate, the micromirror making contact with the landing tip when it reaches the second position, the landing tip storing elastic strain energy when deformed by contact with the micromirror, and converting the elastic strain energy to kinetic energy to assist in pushing the micromirror away from itself when the micromirror moves from the second position back to the first position;

anti-stiction material coated on the respective surfaces of the micromirror and the landing tip at least in areas where they contact; and whereby the combination of the stored elastic strain energy in the landing tip and the anti-stiction material prevent the micromirror from sticking to the landing tip when it moves from the second position to the first position.

2. The micromirror device of claim 1, wherein the anti-stiction material comprises one or more of 3,3,3 trifluoro-PMDCS, FOTS, FDTS, DDTCS, DDMS, V11TCS, APTMS, an epoxide, a methacroloxy, mPEG, or a mercaptosilane.

3. The micromirror device of claim 1, wherein the anti-stiction material on at least a portion of the surfaces of the micromirror or the surface of the landing tip is thicker than 0.3 nanometer.

4. The micromirror device of claim 1, wherein the anti-stiction material on at least a portion of the surfaces of the micromirror or the surface of the landing tip is thicker than 1.0 nanometer.

5. The micromirror device of claim 1, wherein the micromirror is configured to move to contact the landing tip in response to an external signal.

6. The micromirror device of claim 5, wherein the external signal generates an electrostatic force that causes the micromirror to move from the first position to the second position.

7. The micromirror device of claim 1, wherein the substrate comprises a semiconductor material.

8. The micromirror device of claim 1, wherein the substrate comprises a semiconductor material.

* * * * *